United States Patent
Huang

(10) Patent No.: US 8,472,155 B2
(45) Date of Patent: Jun. 25, 2013

(54) LEAKAGE DETECTION PROTECTIVE CIRCUIT

(76) Inventor: Huadao Huang, Wenzhou (CN)

( * ) Notice: Subject to any disclaimer, the term of this patent is extended or adjusted under 35 U.S.C. 154(b) by 43 days.

(21) Appl. No.: 13/181,758

(22) Filed: Jul. 13, 2011

(65) Prior Publication Data
US 2012/0170159 A1     Jul. 5, 2012

(30) Foreign Application Priority Data
Dec. 31, 2010 (CN) .......................... 2010 1 0617324

(51) Int. Cl.
*H02H 1/00* (2006.01)
(52) U.S. Cl.
USPC .......................................................... 361/42
(58) Field of Classification Search
USPC .......................................................... 361/42
See application file for complete search history.

(56) References Cited

U.S. PATENT DOCUMENTS

2009/0180221 A1* 7/2009 Chen .............................. 361/42
2010/0073178 A1* 3/2010 Huang et al. ................. 340/664

* cited by examiner

*Primary Examiner* — Jared Fureman
*Assistant Examiner* — Kevin J Comber
(74) *Attorney, Agent, or Firm* — Mei & Mark LLP

(57) ABSTRACT

The leakage detection protection circuit comprises power input and output ends, an induction coil, a self-excitation coil, a control chip, a controlled silicon rectifier, a commutation diode, a resistor, a current limiting resistor, a filter capacitor, a tripping coil, a pair of main circuit switches linked with a reset button, a test button, and first and second test switches. When the reset button is in a tripped state, the first test switch is open and the second test switch is closed. Additionally, when the reset button is pressed down, the first test switch changes from open to closed, the second test switch remains closed, and the neutral wire of the power input end is connected to the output end of the live wire of the power input end to enable generation of an analog leakage current. Finally, when the reset button is reset, the first and second test switches are both open.

26 Claims, 9 Drawing Sheets

LEAKAGE DETECTION PROTECTIVE CIRCUIT

CLAIM FOR PRIORITY

This application claims priority under 35 U.S.C. §119 to Chinese patent application No. 201010617324.1 filed Dec. 31, 2010, the content of which is incorporated herein by reference in its entirety.

TECHNICAL FIELD

The present invention relates generally to a new leakage detection protective circuit that is installed in a power supply plug/socket/switch circuit interrupter with leakage protective functions and has a life termination detection function and an indication function.

BACKGROUND

Along with the continuous development in the industry of power supply sockets with leakage protective functions (also known as GFCI), even higher requirements are proposed for their functions as well as service safety, especially for the power supply sockets/plugs to be exported to the USA.

Currently, the power sockets/plugs exported to the USA all have life termination detection and indication functions. The most commonly adopted leakage detection protection circuit that is installed in a power supply plug/socket/switch circuit interrupter with leakage protective function is provided with at least one switch linked with a reset button and provided beneath the reset button. At the moment when the reset button is pressed down, this switch is closed, generating an analog leakage current to detect whether the life of the leakage detection protection circuit has terminated. This creates the need to design an analog leakage current generation circuit, which includes the switch, to generate an analog leakage current and to automatically detect whether the life of the leakage detection protection circuit has terminated. This design increases the complexity of the leakage detection protection circuit.

Also, normally the leakage detection protection circuit has been designed with a circuit that can detect whether the life of the leakage detection protection circuit has terminated by pressing a test button to manually generate an analog leakage current.

SUMMARY

I propose a new leakage detection protection circuit that can automatically detect whether the life of the leakage detection protection circuit has terminated by making full use of the existing circuit which manually generates an analog leakage current. Another goal is to provide a new leakage detection protection circuit with a simple circuit structure. Accordingly, the leakage detection protection circuit comprises a power input end, a power output end, an induction coil configured to detect a leakage current, a self-excitation coil configured to detect a low resistance fault, a control chip, a controlled silicon rectifier, a commutation diode, a resistor, a current limiting resistor, a filter capacitor, a tripping coil with a built-in iron core, a pair of main circuit switches linked with a reset button, a test button, a first test switch, and a second test switch.

Both the power input end and the power output end comprise a live wire and a neutral wire. The controlled silicon rectifier comprises a cathode, an anode, and a control pole. Both the first and second test switches comprise a first end and a second end. The test button is linked with the reset button, the first test switch is linked with the test button, and the second test switch is linked with the rest button. The live wire and the neutral wire of the power input end both pass through the induction coil and the self excitation coil and both have an input end and an output end.

The second end of the first test switch is connected to the first end of the second test switch. The second end of the second test switch is connected to the output end of the live wire of the power input end.

The leakage detection protection circuit is configured so that when the reset button is in a tripped state, the first test switch is in an open state and the second test switch is in a closed state. The circuit is also configured so that when the reset button is pressed down, the first test switch changes from the open state to a closed state, and the second test switch remains in the closed state, and the neutral wire of the power input end is connected to the output end of the live wire of the power input end to enable generation of an analog leakage current. Finally, the circuit is configured so that when the reset button is in a reset state, the first test switch and the second test switch are both open.

BRIEF DESCRIPTION OF THE DRAWINGS

The accompanying drawings, which are incorporated in and constitute a part of this specification, illustrate several embodiments and together with the description, serve to explain the principles of the leakage detection protective circuit.

DETAILED DESCRIPTION

Reference will now be made in detail to the present exemplary embodiments, examples of which are illustrated in the accompanying drawings. Wherever possible, the same reference numbers will be used throughout the drawings to refer to the same or like parts.

Figure 1:
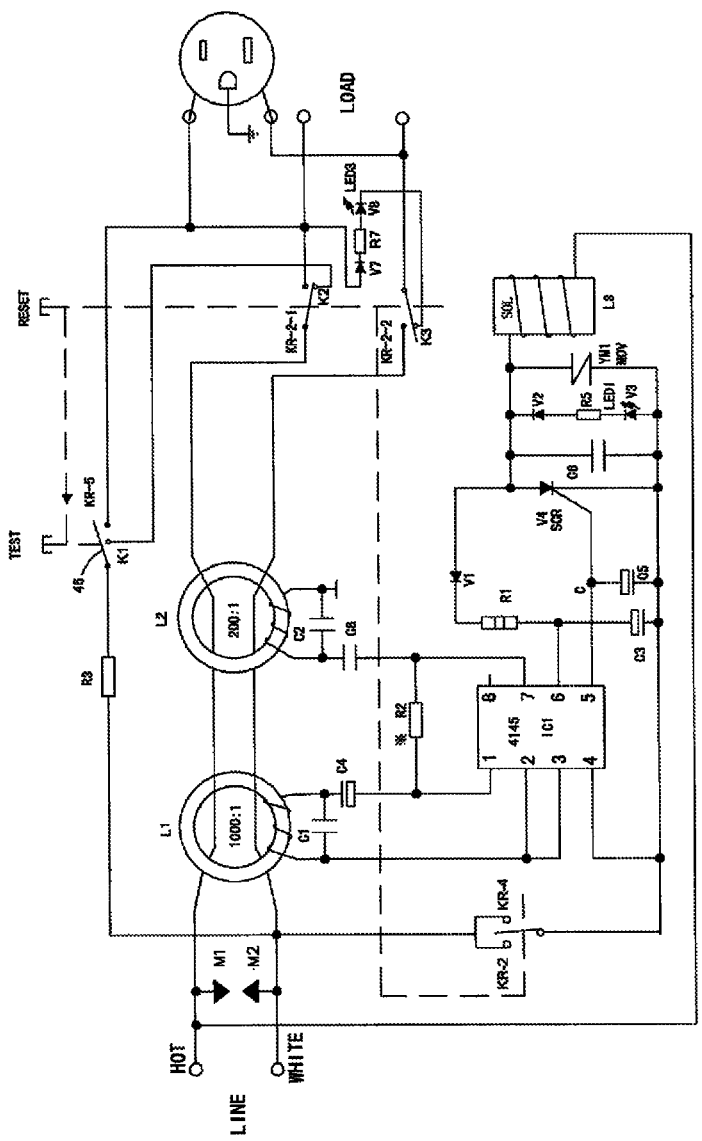
FIG. 1 is a circuit diagram of Embodiment 1 of the leakage detection protection circuit.

As shown in FIG. 1, the new leakage detection protective circuit may comprise induction coil L1 installed on the circuit board for detecting a leakage current, self-excitation coil L2 for detecting a low resistance fault, control chip IC1 (Model RV4145), controlled silicon rectifier V4, commutation diode V1, filter capacitor C3, tripping coil SOL with built-in iron core, main circuit switches KR-2-1 & KR-2-2 linked with the reset button, false-wiring warning lamp LED3, power-on indicator LED1, instantaneous power supply connection switch KR-4 linked with the reset button, and power supply switch KR-2 linked with the reset button.

The live wire HOT of the power input end LINE passes through induction coil L1 for detecting leakage currents and self-excitation coil L2 for detecting low resistance faults. It is connected, through main circuit switch KR-2-1 linked with the reset button, to the live wire output plug bush of the power supply output jacks and the live wire of power output end LOAD.

The neutral wire WHITE of the power input end LINE passes through induction coil L1 for detecting leakage currents and self-excitation coil L2 for detecting low resistance faults. It is connected, through main circuit switch KR-2-2 linked with the reset button, to the neutral wire output plug bush of the power supply output jacks and the neutral wire of power output end LOAD.

The signal output ends of induction coil L1 for detecting leakage currents and self-excitation coil L2 for detecting low resistance faults are connected to the detection signal input pins 1, 2, 3 & 7 of control chip IC1. The control signal output pin 5 of control chip IC1 is connected to the control pole of controlled silicon rectifier V4.

As shown in FIG. 1, the anode of controlled silicon rectifier V4 is connected, through tripping coil SOL, to the live wire HOT of the power input end LINE. The cathode of controlled silicon rectifier V4 is connected, through instantaneous power supply connection switch KR-4 or power supply switch KR-2 linked with the reset button RESET, to the neutral wire WHITE of the power input end LINE. Instantaneous power supply connection switches KR-4 and KR-2 are connected in parallel.

The power input pin 6 of control chip IC1 is connected, through resistor R1, commutation diode V1 and tripping coil SOL, to the live wire HOT of the power input end LINE. The working ground input pin 4 of control chip IC1 is connected, through instantaneous power supply connection switch KR-4 or power supply switch KR-2 linked with the reset button RESET, to the neutral wire WHITE of the power input end LINE. Instantaneous power supply connection switches KR-4 and KR-2 are connected in parallel.

When the reset button RESET is pressed down, power supply switch KR-2 is open, instantaneous power supply connection switch KR-4 closes to supply working power to control chip IC1, controlled silicon rectifier V4, commutation diode V1, resistor R1, filter capacitor C3 and tripping coil SOL with built-in iron core, and the leakage detection protection circuit works with power on. After reset button RESET resets, instantaneous power supply connection switch KR-4 is open, power supply switch KR-2 closes, and power supply switch KR-2 supplies working power to control chip IC1, controlled silicon rectifier V4, commutation diode V1, resistor R1, filter capacitor C3 and tripping coil SOL with built-in iron core. When the reset button RESET is in a tripped state, instantaneous power supply connection switch KR-4 and power supply switch KR-2 are both in an open state, the elements such as control chip IC1, controlled silicon rectifier V4, tripping coil SOL, resistor, and capacitors in the leakage detection protection circuit are not electrified. The entire leakage detection protection circuit is also not electrified, being in a power-saving state. This design makes this leakage detection protection circuit more consistent with power-saving and environment-friendly requirements. Moreover, because the elements such as control chip IC1, controlled silicon rectifier V4, tripping coil SOL, resistor, and capacitor in the circuit are not electrified when the leakage detection protection circuit is not operating, the elements are more resistant to ageing, prolonging the service life of the elements and the entire circuit.

The significant differences between this leakage detection protection circuit and commonly used leakage detection protection circuits are as follows:

1. This leakage detection protection circuit links test button TEST and reset button RESET through a mechanical structure (e.g. an arm extended from test button TEST, which is located beneath the reset button). The first test switch K1 linked with test button TEST is added.

2. The second test switch K2 linked with the reset button RESET is added.

3. When the reset button is in a tripped state, the first test switch K1 is in an open state and the second test switch K2 in a closed state. When the reset button RESET is pressed down and moves the linked test button TEST, the first test switch K1 becomes closed while the second test switch K2 is still in a closed state. When the reset button RESET is in a reset state, both the first test switch K1 and the second test switch K2 are open.

4. One end of the first test switch K1 is connected, through current-limiting resistor R3, to the neutral wire at power input end, and the other end is connected to one end of the second test switch K2. The other end of the second test switch K2 is connected to the power live wire passing through induction coil L1 and self-excitation coil L2.

When the reset button is in a tripped state, the first test switch K1 is open, the second test switch K2 is closed, and the neutral wire at power input end is not connected to the power live wire passing through induction coil L1 and self-excitation coil L2. When the reset button is pressed down, the first test switch K1 and the second test switch K2 are both closed, and the neutral wire at power input end is connected to the power live wire passing through induction coil L1 and self-excitation coil L2, forming a circuit that automatically generates an analog leakage current. After the reset button resets, the first test switch K1 and the second test switch K2 are both open, and the neutral wire at power input end is not connected to the power live wire passing through induction coil L1 and self-excitation coil L2.

After the user connects the power input end and output end of the leakage detection protection circuit correctly, pressing reset button RESET moves the linked test button TEST, making the first test switch K1 close. The second test switch K2 is now also in a closed state. At this moment, the live wire HOT of the power input end LINE passes through induction coil L1 and self-excitation coil L2, and is connected, through the second test switch K2 (closed), the first test switch K1 (closed) and resistor R3, to the neutral wire at the power input end to form a closed circuit. Through this closed circuit, an analog leakage current is generated.

Because the reset button RESET is pressed down at this moment, instantaneous power supply connection switch KR-4 linked with the reset button RESET is closed, and control chip IC1, controlled silicon rectifier V4, commutation diode V1, resistor R1, filter capacitor C3 and tripping coil SOL with built-in iron core in the leakage detection protection circuit are powered to operate.

If the life of the leakage detection protection circuit has not terminated and induction coil L1 and self-excitation coil L2 can sense the leakage failure existing in the power supply system, induction coil L1 and self-excitation coil L2 will output an induction signal to control chip IC1 and Pin 5 of control chip IC1 will output a control signal, making controlled silicon rectifier V4 break over. The electromagnetic locking mechanism in the power supply socket/plug will act to make the reset button reset. The first test switch K1 and the second test switch K2 will become open, and the analog leakage current will disappear.

After the reset button resets, power supply connection switch KR-4 linked with the reset button is instantaneous open, power supply switch KR-2 is closed, and power supply switch KR-2 supplies power to the leakage detection protection circuit. After the reset button resets, main circuit switches KR-2-1 & KR-2-2 linked with the reset button are closed, the power output end of the leakage protection socket/plug/switch has power output, and the automatic life testing for the leakage protection function is completed.

If the life of the leakage detection protection circuit is terminated, the electromagnetic locking mechanism in the power socket/plug will not act, preventing the reset button from resetting permanently. So main circuit switches KR-2-1 & KR-2-2 linked with the reset button are open all the time, and the power output end of the leakage protection socket/plug/switch never has power output. This provides the user with safer leakage protection.

For timely reflection of the working state of the leakage detection protective circuit, as shown in FIG. 1, this leakage detection protection circuit also includes two indication circuits, i.e. a power-on indication circuit and a working status indication circuit.

Figure 9:
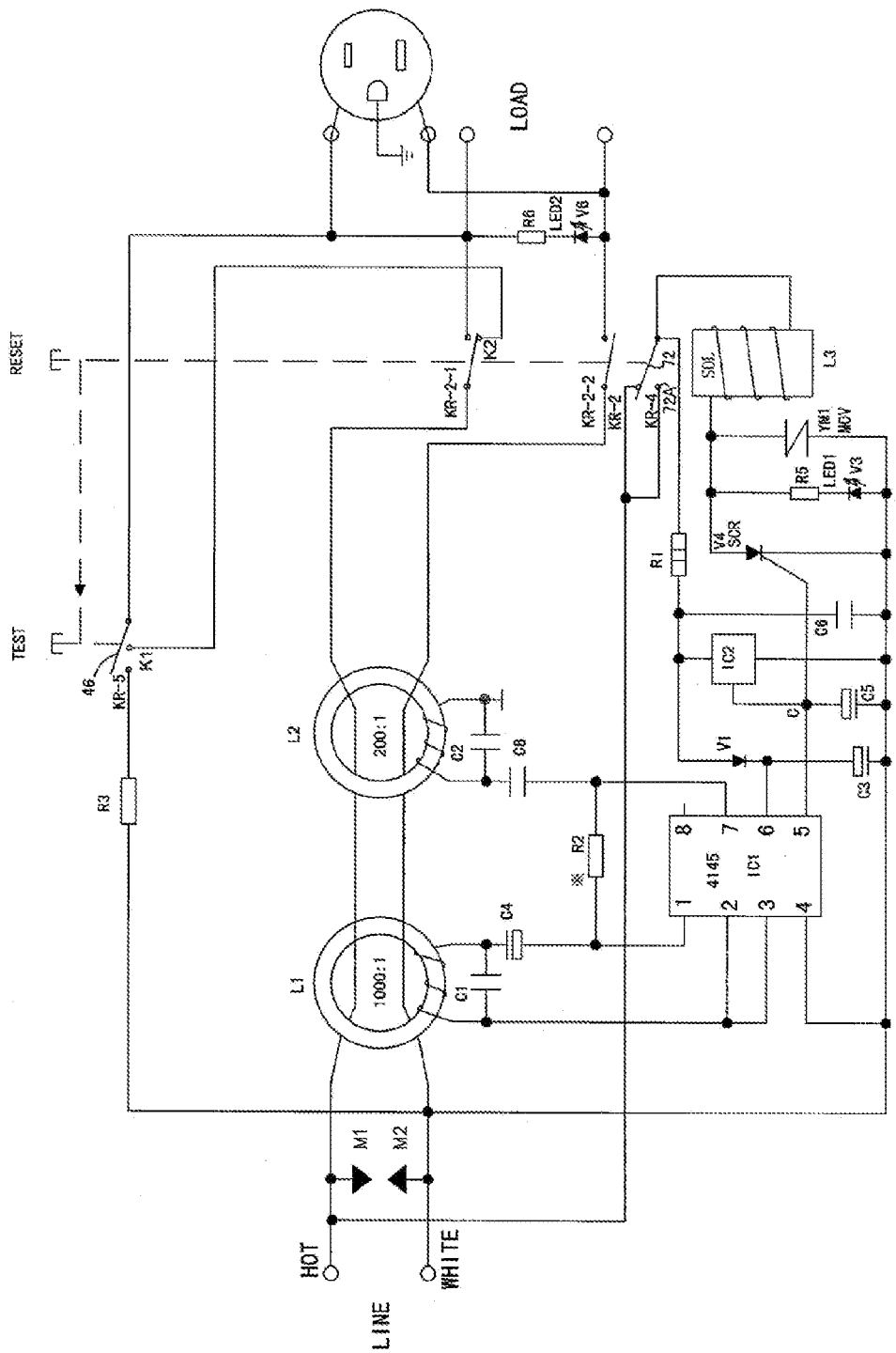
FIG. 9 is a circuit diagram of Embodiment 9 of the leakage detection protection circuit.

The power-on indication circuit is composed of power-on indicator LED1, diode V2 and current-limiting resistor R5, or otherwise composed of power-on indicator LED1 and current-limiting resistor R5 as shown in FIG. 9. The power-on indicator LED1, diode V2 and current-limiting resistor R5, or otherwise power-on indicator LED1 and current-limiting resistor R5, are connected in series. One end is connected through tripping coil SOL to the live wire at power input end, and the other end is connected, through instantaneous power supply connection switch KR-4 or power supply switch KR-2 linked with the reset button RESET, to the neutral wire at power input end.

When the reset button RESET is pressed down and reset, there is current flowing through the power-on indication circuit, and power-on indicator LED 1 is on. This indicates that the leakage detection protection circuit works normally and the power output end of the power socket/plug has power output. When power-on indicator LED 1 is off, it indicates that the leakage detection protection circuit is not working and the power output end of the power socket/plug has no power output.

The false-wiring warning circuit is composed of false-wiring warning switch K3 linked with the reset button, false-wiring warning lamp LED3, resistor R7 and diode V7, or otherwise composed of false-wiring warning lamp LED2 and resistor R6 as shown in FIG. 9. False-wiring warning switch K3, false-wiring warning lamp LED3, resistor R7 and diode V7, or otherwise false-wiring warning lamp LED3 and resistor R7, are connected in series with one end connected to the live wire of power output end LOAD and with the other end connected to the neutral wire of power output end LOAD.

When the reset button is in a tripped state, false-wiring warning switch K3 linked with the reset button is in a closed state, and is connected to the neutral wire of power output end. If the installer mistakenly connects the wall-mounted power supply live & neutral wires with the live & neutral wires of power output end LOAD of the leakage detection protection circuit, because the false-wiring warning switch K3 linked with the reset button is in a closed state, the live wire of wall-mounted power supply is connected, through the live wire terminal of power output end LOAD, diode V7, resistor R7, false-wiring warning lamp LED3, closed false-wiring warning switch K3 and the neutral wire terminal of power output end, to the neutral wire of wall-mounted power supply, forming a closed circuit. False-wiring warning lamp LED3 is on, and is prevented from reset, reminding the installer of the wiring mistake in this leakage detection protection circuit.

When the reset button is in a tripped state and the power input end LINE of this leakage detection protection circuit is connected correctly with the wall-mounted power supply live wire and neutral wire, even if the false-wiring warning switch K3 is closed at this moment, the false-wiring warning circuit will have no current flowing because the power live/neutral wire terminals of power output end LOAD of the leakage detection protection circuit are not electrified. Therefore, the false-wiring warning lamp LED3 is off, indicating that this leakage detection protection circuit is wired correctly and can reset normally.

When the installer correctly connects wall-mounted power supply live and neutral wires with the live and neutral wires at the power input end LINE of the leakage detection protection circuit, after reset button RESET resets, the said false-wiring warning switch K3 linked with the reset button RESET is in open state, the said false-wiring warning lamp LED3 is off, and the power-on indicator LED1 connected in parallel between the anode and cathode of the controlled silicon rectifier SCR is on.

This leakage detection protection circuit reflects the working state of the circuit through the on/off of power-on indicator LED 1 and through the on/off of false-wiring warning lamp LED3. In the first embodiment, power-on indicator LED1 and false-wiring warning lamp LED3 are indicators of two different colors.

Figure 2:
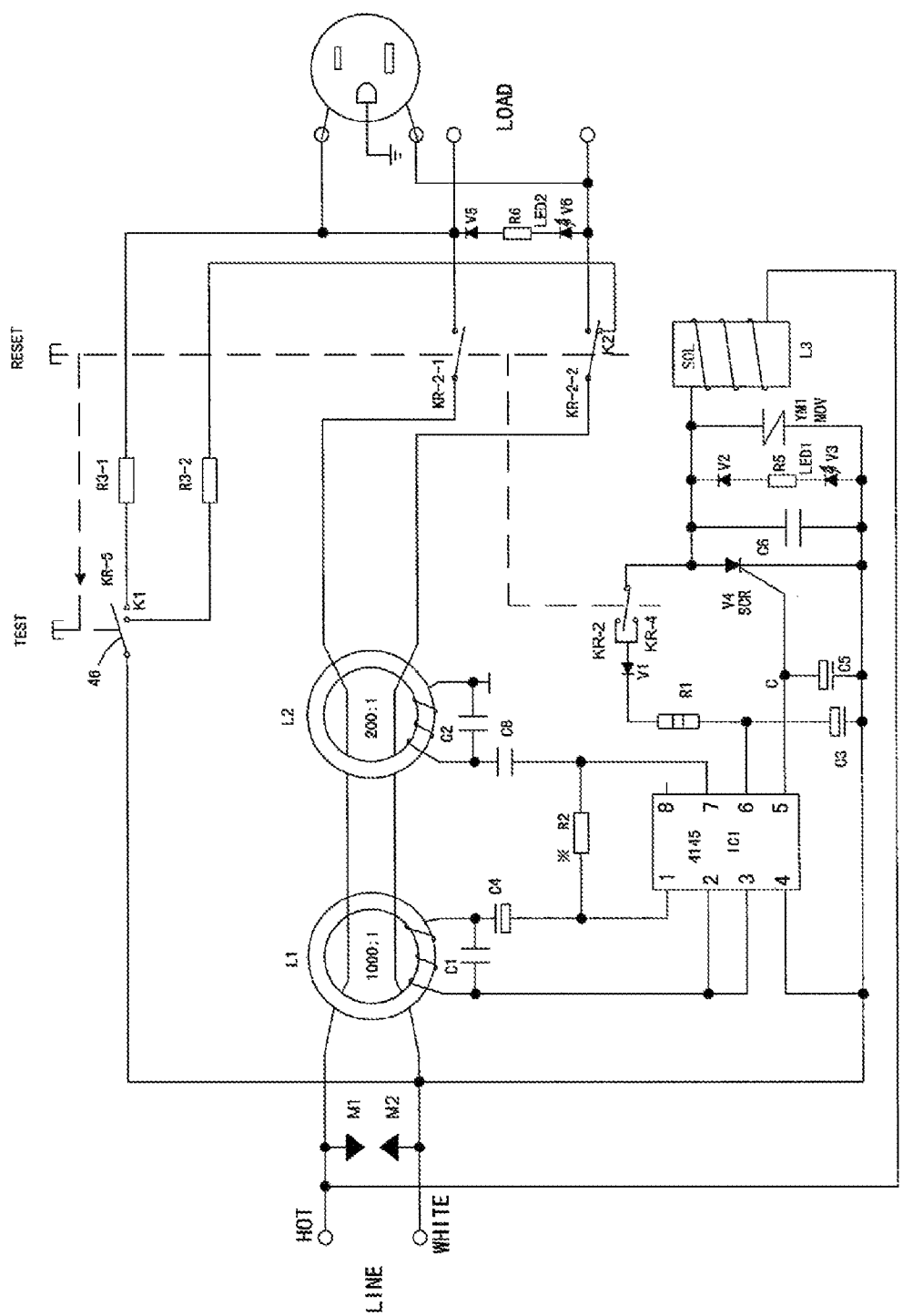
FIG. 2 is a circuit diagram of Embodiment 2 of the leakage detection protection circuit.

FIG. 2 is a circuit diagram of Embodiment 2 of this leakage detection protection circuit. The differences between the leakage detection protection circuit shown in FIG. 2 and that shown in FIG. 1 are as follows:

1. One end of the first test switch K1 in the leakage detection protection circuit shown in FIG. 2 is connected to the neutral wire at power input end, and the other end is connected through the current-limiting resistor to one end of the second test switch K2. The other end of the second test switch K2 is connected to the power neutral wire passing through induction coil L1 and self-excitation coil L2.

When the reset button is in a tripped state, the first test switch K1 is open, the second test switch K2 is closed, and the neutral wire at power input end is not connected to the power neutral wire passing through induction coil L1 and self-excitation coil L2. When the reset button is pressed down, the first test switch K1 and the second test switch K2 are both closed, and the neutral wire at power input end is connected to the power neutral wire passing through induction coil L1 and self-excitation coil L2, forming a circuit for detecting low-resistance failures. After the reset button resets, the first test switch K1 and the second test switch K2 are both open, and the neutral wire at power input end is not connected to the power neutral wire passing through induction coil L1 and self-excitation coil L2.

2. In the leakage detection protection circuit shown in FIG. 2, the false-wiring warning circuit, which is composed of false-wiring warning switch K3 linked with the reset button, false-wiring warning lamp LED3, resistor R7 and diode V7, is eliminated.

Instead, a power output indication circuit is connected directly between the live wire and neutral wire of the power output end. This power output indication circuit is composed of diode V5, resistor R6 and output indicator LED2 which are connected in series with each other. When the power output end has power output, output indicator LED2 is on.

3. The anode of controlled silicon rectifier V4 in the leakage detection protection circuit as shown in FIG. 2 is connected, through tripping coil SOL, to the live wire at power input end. The cathode of controlled silicon rectifier V4 is connected directly to the neutral wire at power input end.

Power input pin 6 of control chip IC1 in the leakage detection protection circuit as shown in FIG. 2 is connected, through resistor R1, commutation diode V1, the parallel-connected instantaneous power supply connection switch KR-4 & power supply switch KR-2 linked with the reset button RESET and tripping coil SOL, to the live wire HOT of the power input end LINE. Working ground input pin 4 of control chip IC1 is connected directly to the neutral wire WHITE of the power input end LINE.

Figure 3:
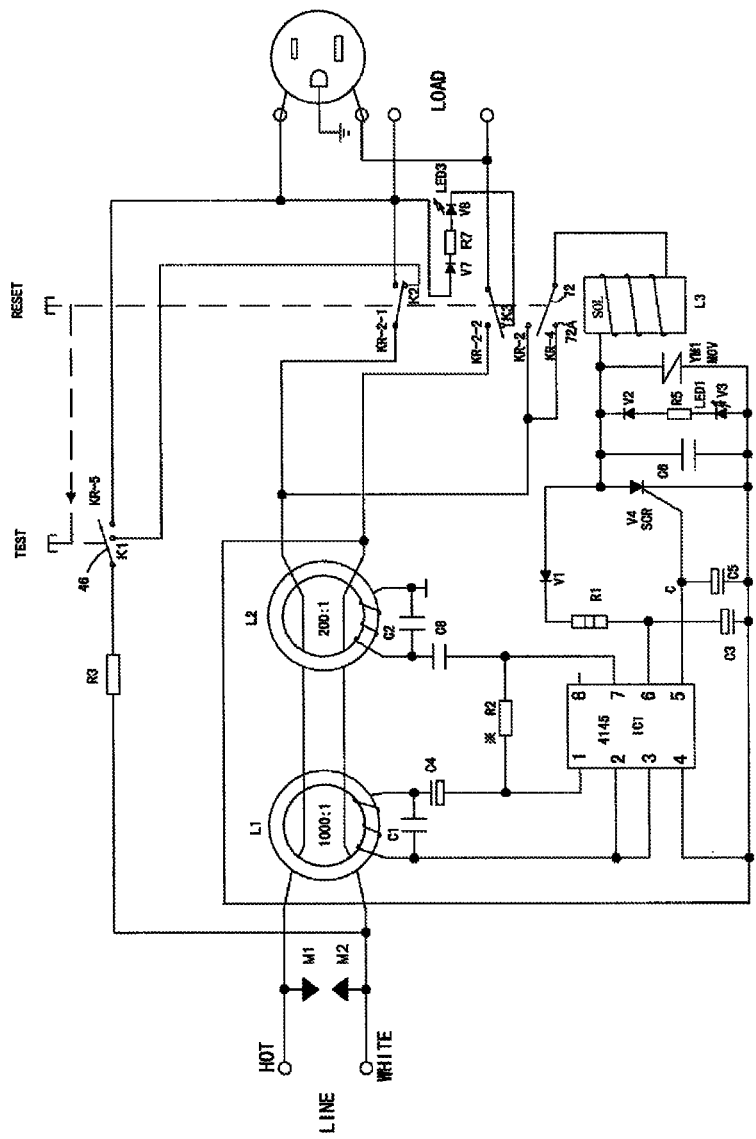
FIG. 3 is a circuit diagram of Embodiment 3 of the leakage detection protection circuit.

FIG. 3 is a circuit diagram of Embodiment 3 of this leakage detection protection circuit. The operation principle of the leakage detection protection circuit shown in FIG. 3 is identical to that of the leakage detection protection circuit shown in FIG. 1, and the circuits are generally the same. The differences between the leakage detection protection circuit shown in FIG. 3 and that shown in FIG. 1 are as follows:

The anode of controlled silicon rectifier V4 in the leakage detection protection circuit shown in FIG. 3 is connected, through tripping coil SOL and parallel-combined instantaneous power supply connection switch KR-4 & power supply switch KR-2 linked with the reset button RESET, to the power live wire passing through induction coil L1 and self-excitation coil L2. The cathode of controlled silicon rectifier V4 is connected to the neutral wire at power input end passing through induction coil L1 and self-excitation coil L2.

Power input pin 6 of control chip IC1 in the leakage detection protection circuit shown in FIG. 3 is connected, through resistor R1, commutation diode V1, tripping coil SOL and the parallel-connected instantaneous power supply connection switch KR-4 & power supply switch KR-2 linked with the reset button RESET, to the power live wire passing through induction coil L1 and self-excitation coil L2. Working ground input pin 4 of control chip IC1 is connected to the neutral wire at power input end passing through induction coil L1 and self-excitation coil L2.

Figure 4:
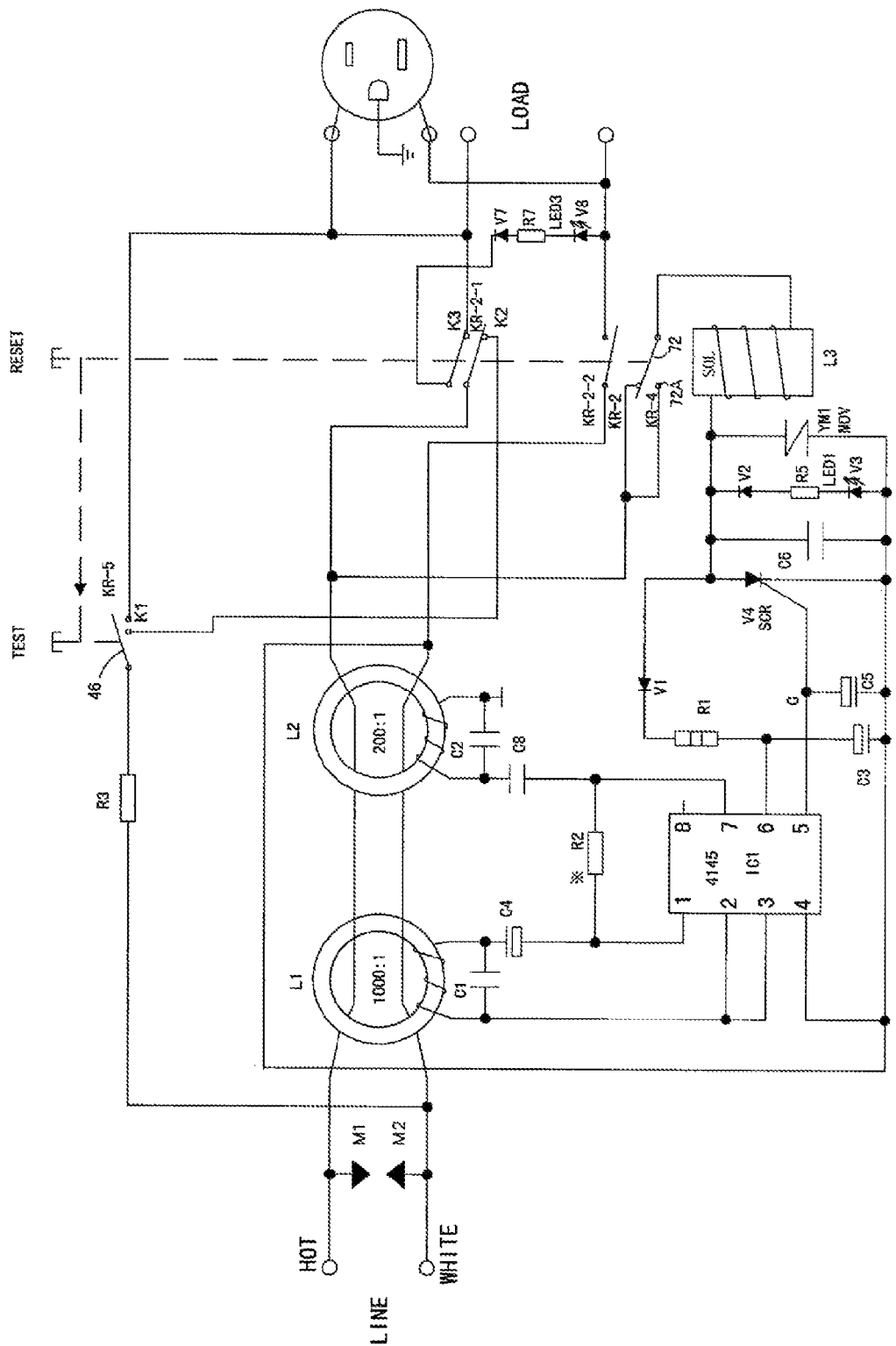
FIG. 4 is a circuit diagram of Embodiment 4 of the leakage detection protection circuit.

FIG. 4 is a circuit diagram of Embodiment 4 of this leakage detection protection circuit. The operation principle of the leakage detection protection circuit shown in FIG. 4 is identical to that of the leakage detection protection circuit shown in FIG. 3, and the circuits are generally the same. The differences between the leakage detection protection circuit shown in FIG. 4 and that shown in FIG. 3 are as follows:

1. The false-wiring warning circuit is composed of false-wiring warning switch K3 linked with the reset button, false-wiring warning lamp LED3, resistor R7 and diode V7. One end of the lamp, resistor, and diode group is connected to the neutral wire of the power output end LOAD, and the other end is connected through false-wiring warning switch K3 with the live wire of the power output end LOAD.

When the reset button is in a tripped state, false-wiring warning switch K3 linked with the reset button is in a closed state, and is connected to the live wire of power output end. If the installer mistakenly connects the wall-mounted power supply live & neutral wires with the live & neutral wires of power output end LOAD of the leakage detection protection circuit, because false-wiring warning switch K3 linked with the reset button is in a closed state, the live wire of wall-mounted power supply is connected, through the live wire terminal of power output end LOAD, closed false-wiring warning switch K3, diode V7, resistor R7, false-wiring warning lamp LED3, and the neutral wire terminal of power output end, to the neutral wire of wall-mounted power supply, forming a closed circuit. False-wiring warning lamp LED3 is on, and is prevented from reset, reminding the installer of the wiring mistake in this leakage detection protection circuit.

When the reset button is in a tripped state and the power input end LINE of this leakage detection protection circuit is connected correctly with the wall-mounted power supply live wire and neutral wire, even if the false-wiring warning switch K3 is closed at this moment, the false-wiring warning circuit will still have no current flowing because the power live/neutral wire terminals of power output end LOAD of the leakage detection protection circuit are not electrified. Therefore, the false-wiring warning lamp LED3 is off, indicating that this leakage detection protection circuit is wired correctly and can reset normally.

2. The anode of controlled silicon rectifier V4 in the leakage detection protection circuit shown in FIG. 4 is connected, through tripping coil SOL and the parallel-connected instantaneous power supply connection switch KR-4 & power supply switch KR-2 linked with the reset button RESET, to the power live wire passing through induction coil L1 and self-excitation coil L2. The cathode of controlled silicon rectifier V4 is connected to the power neutral wire passing through induction coil L1 and self-excitation coil L2.

Power input pin 6 of control chip IC1 in the leakage detection protection circuit as shown in FIG. 4 is connected, through resistor R1, commutation diode V1, tripping coil SOL and the parallel-connected instantaneous power supply connection switch KR-4 & power supply switch KR-2 linked with the reset button RESET, to the power live wire passing through induction coil L1 and self-excitation coil L2. Working ground input pin 4 of control chip IC1 is connected to the power neutral wire passing through induction coil L1 and self-excitation coil L2.

When the reset button RESET is in a tripped state, power supply switch KR-2 is closed, instantaneous power supply connection switch KR-4 is open, power supply switch KR-2 supplies working power to control chip IC1, controlled silicon rectifier V4, and tripping coil SOL. When the reset button RESET is pressed down, power supply switch KR-2 is open, instantaneous power supply connection switch KR-4 is closed, and instantaneous power supply connection switch KR-4 supplies power to control chip IC1, controlled silicon rectifier V4 and tripping coil SOL. After reset button RESET resets, instantaneous power supply connection switch KR-4 turns from a closed state to an open state, power supply switch KR-2 turns from an open state to a closed state, and power supply switch KR-2 supplies power to control chip IC1, controlled silicon rectifier V4 and tripping coil SOL.

Figure 5:
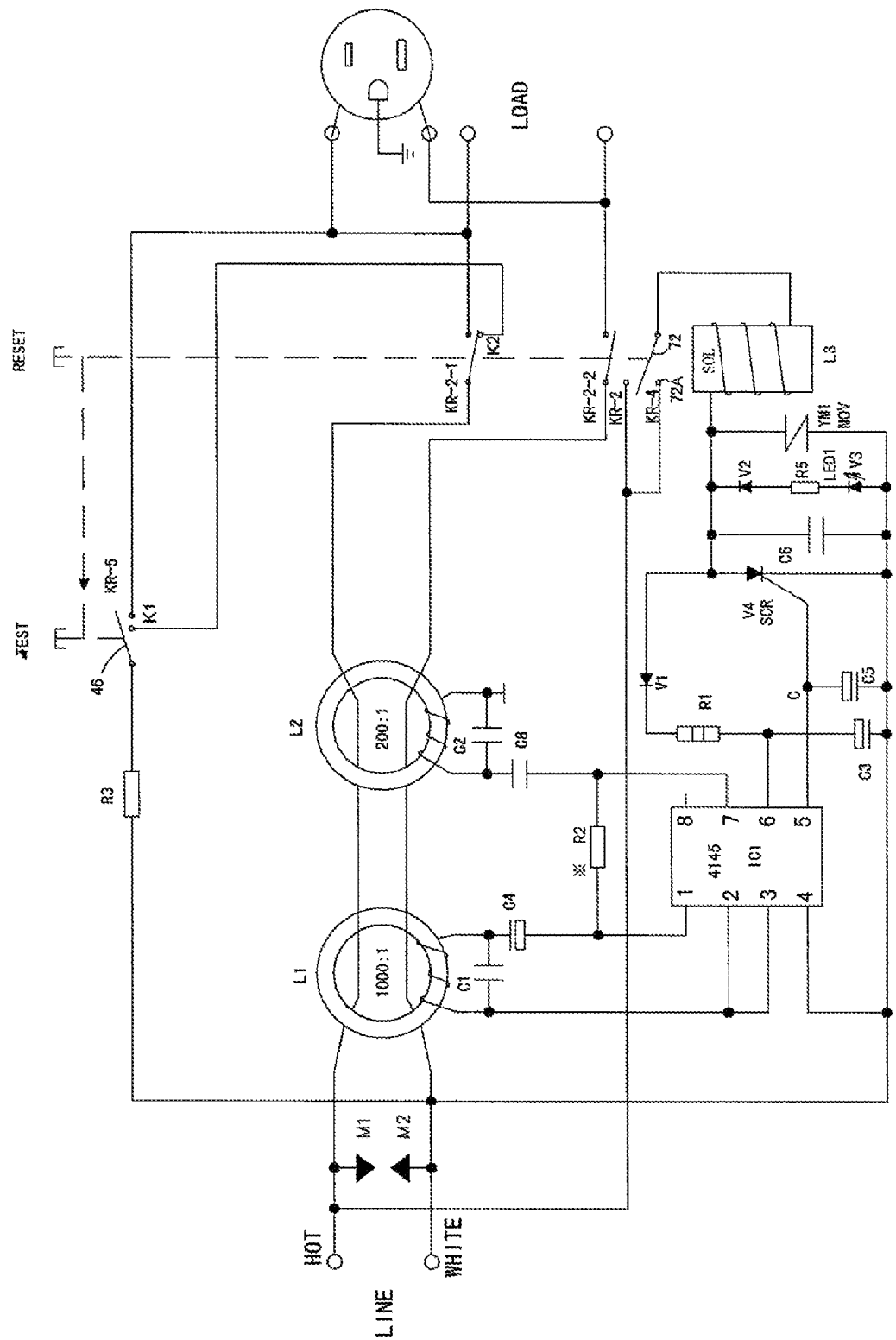
FIG. 5 is a circuit diagram of Embodiment 5 of the leakage detection protection circuit.

FIG. 5 is a circuit diagram of Embodiment 5 of this leakage detection protection circuit. The operation principle of the leakage detection protection circuit shown in FIG. 5 is identical to that of the leakage detection protection circuit shown in FIG. 1, and the circuits are generally the same. The differences between the leakage detection protection circuit shown in FIG. 5 and that shown in FIG. 1 are as follows:

1. In the leakage detection protection circuit shown in FIG. 5, the false-wiring warning circuit, which is composed of false-wiring warning switch K3 linked with the reset button, false-wiring warning lamp LED3, resistor R7 and diode V7, is eliminated 2. The anode of controlled silicon rectifier V4 of the leakage detection protection circuit shown in FIG. 5 is connected, through tripping coil SOL and the parallel-connected instantaneous power supply connection switch KR-4 & power supply switch KR-2 linked with the reset button RESET, to the live wire at power input end. The cathode of controlled silicon rectifier V4 is connected to the neutral wire at power input end.

Power input pin 6 of control chip IC1 in the leakage detection protection circuit shown in FIG. 5 is connected, through resistor R1, commutation diode V1, tripping coil SOL, the parallel-connected instantaneous power supply connection switch KR-4 & power supply switch KR-2 linked with the reset button RESET, to the live wire at power input end. Working ground input pin 4 of control chip IC1 is connected to the neutral wire at power input end.

Figure 6:
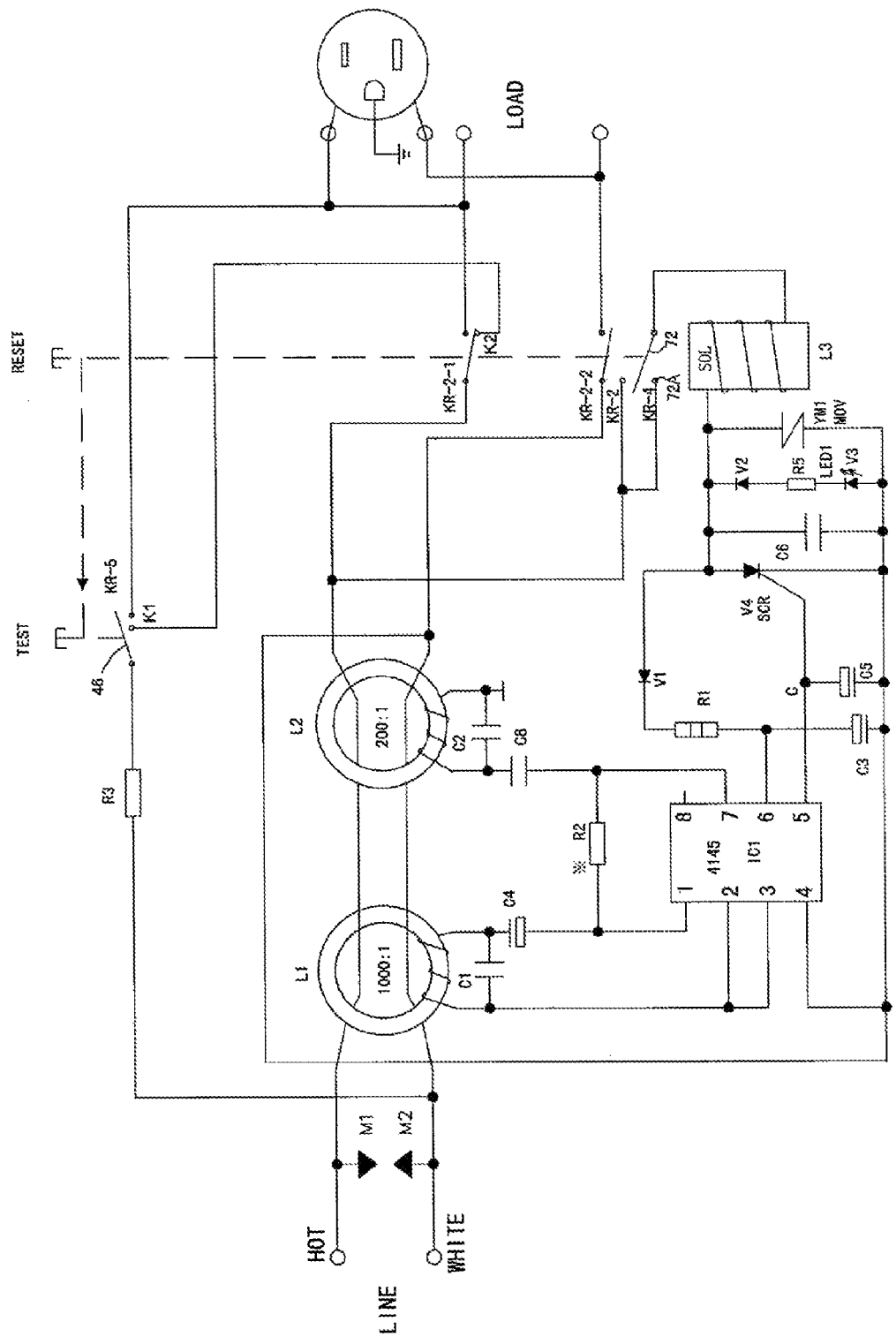
FIG. 6 is a circuit diagram of Embodiment 6 of the leakage detection protection circuit.

FIG. 6 is a circuit diagram of Embodiment 6 of this leakage detection protection circuit. The operation principle of the leakage detection protection circuit shown in FIG. 6 is identical to that of the leakage detection protection circuit shown in FIG. 5, and the circuits are generally the same. The differences between the leakage detection protection circuit shown in FIG. 6 and that shown in FIG. 5 are as follows:

The anode of controlled silicon rectifier V4 in the leakage detection protection circuit shown in FIG. 6 is connected, through tripping coil SOL and the parallel-connected instantaneous power supply connection switch KR-4 & power supply switch KR-2 linked with the reset button RESET, to the power live wire passing through induction coil L1 and self-excitation coil L2. The cathode of controlled silicon rectifier V4 is connected to the power neutral wire passing through induction coil L1 and self-excitation coil L2.

Power input pin 6 of control chip IC1 in the leakage detection protection circuit shown in FIG. 6 is connected, through resistor R1, commutation diode V1, tripping coil SOL and the parallel-connected instantaneous power supply connection switch KR-4 & power supply switch KR-2 linked with the reset button RESET, to the power live wire passing through induction coil L1 and self-excitation coil L2. Working ground input pin 4 of control chip IC1 is connected through the power neutral wire passing through induction coil L1 and self-excitation coil L2.

Figure 7:
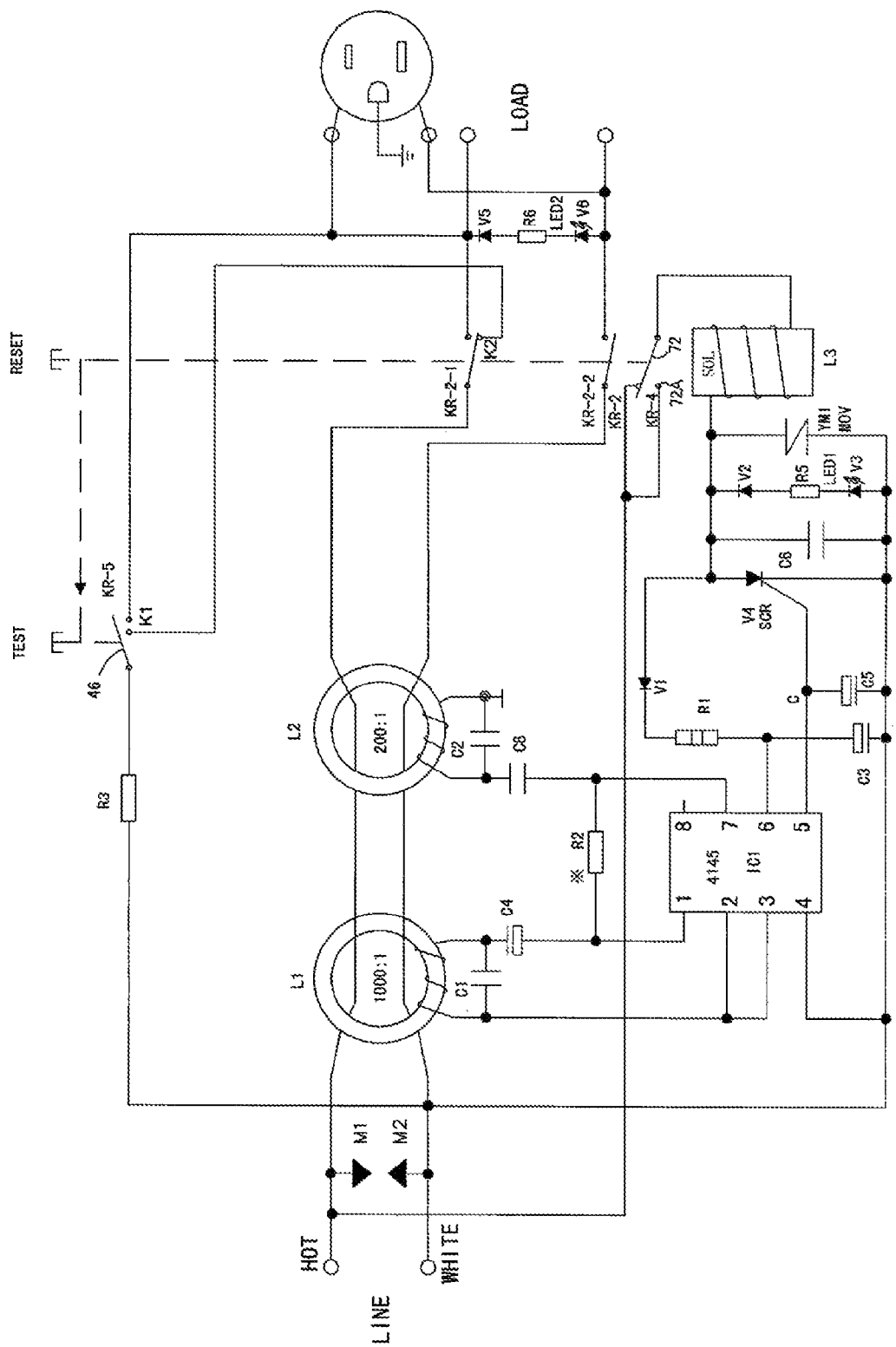
FIG. 7 is a circuit diagram of Embodiment 7 of the leakage detection protection circuit.

FIG. 7 is a circuit diagram of Embodiment 7 of this leakage detection protection circuit. The operation principle of the leakage detection protection circuit shown in FIG. 7 is identical to that of the leakage detection protection circuit shown in FIG. 1, and the circuits are generally the same. The differences between the leakage detection protection circuit shown in FIG. 7 and that shown in FIG. 1 are as follows:

1. In the leakage detection protection circuit shown in FIG. 7, the false-wiring warning circuit, which is composed of false-wiring warning switch K3 linked with the reset button, false-wiring warning lamp LED3, resistor R7 and diode V7, is eliminated.

Instead, a power output indication circuit is connected directly between the live wire and neutral wire of the power output end. This power output indication circuit is composed of diode V5, resistor R6 and output indicator LED2 which are connected in series with each other. When the power output end has power output, output indicator LED2 is on.

2. The anode of controlled silicon rectifier V4 in the leakage detection protection circuit shown in FIG. 7 is connected, through tripping coil SOL and the parallel-connected instantaneous power supply connection switch KR-4 & power supply switch KR-2 linked with the reset button RESET, to the live wire at power input end. The cathode of controlled silicon rectifier V4 is connected to the neutral wire at power input end.

Power input pin 6 of control chip IC1 in leakage detection protection circuit shown in FIG. 7 is connected, through resistor R1, commutation diode V1, tripping coil SOL and the parallel-connected instantaneous power supply connection switch KR-4 & power supply switch KR-2 linked with the reset button RESET, to the live wire at power input end. Working ground input pin 4 of control chip IC1 is connected to the neutral wire at power input end.

When the reset button RESET is in a tripped state, power supply switch KR-2 is closed, instantaneous power supply connection switch KR-4 is open, and power supply switch KR-2 supplies power to control chip IC1, controlled silicon rectifier V4 and tripping coil SOL. When the reset button RESET is pressed down, power supply switch KR-2 is open, instantaneous power supply connection switch KR-4 is closed, and instantaneous power supply connection switch KR-4 supplies power to control chip IC1, controlled silicon rectifier V4 and tripping coil SOL. After reset button RESET resets, instantaneous power supply connection switch KR-4 turns from a closed state to an open state, power supply switch KR-2 turns from open state to closed state, and power supply switch KR-2 supplies power to control chip IC1, controlled silicon rectifier V4 and tripping coil SOL.

Figure 8:
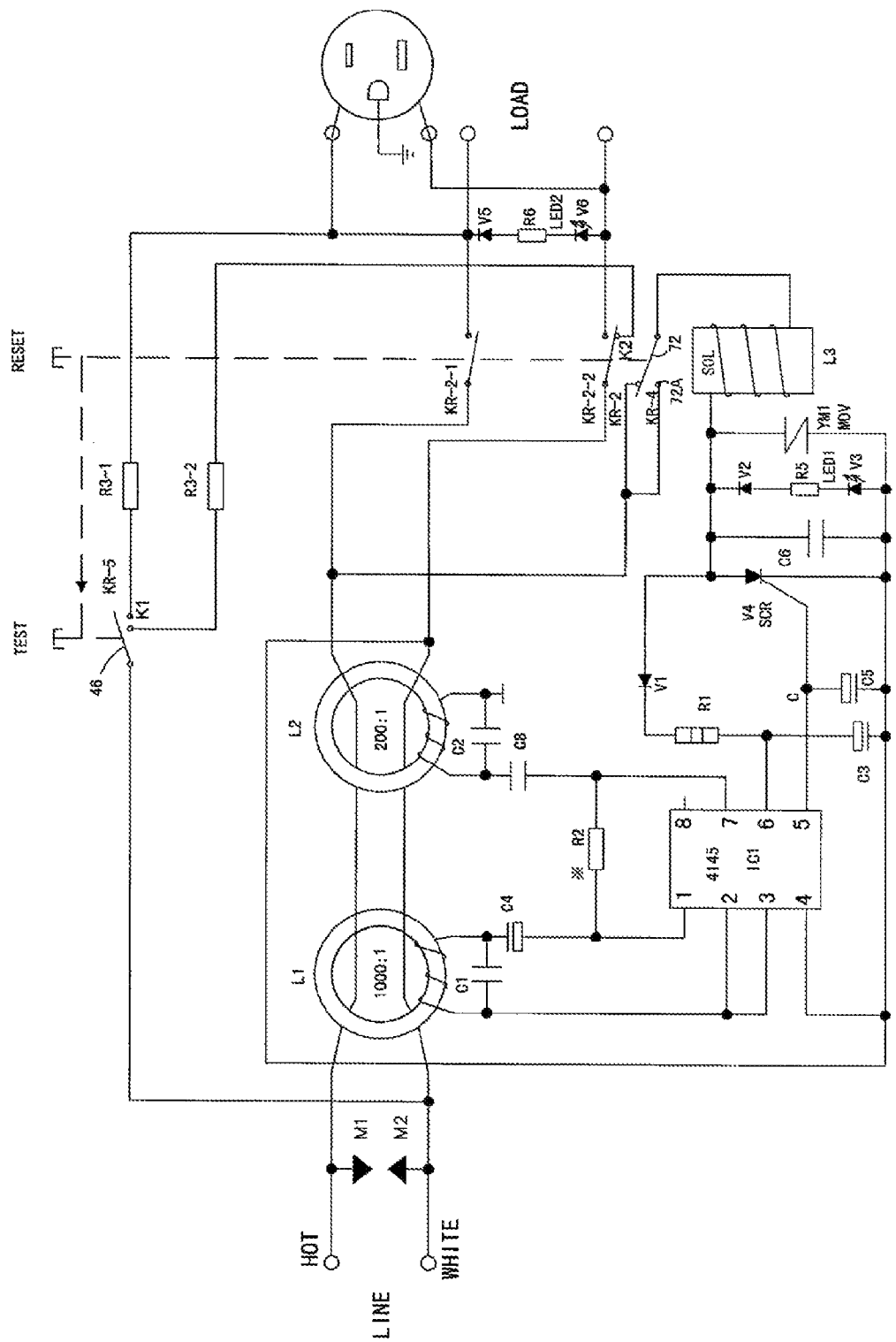
FIG. 8 is a circuit diagram of Embodiment 8 of the leakage detection protection circuit.

FIG. 8 is a circuit diagram of Embodiment 8 of this leakage detection protection circuit. The operation principle of the leakage detection protection circuit shown in FIG. 8 is identical to that of the leakage detection protection circuit shown in FIG. 2, and the circuits are generally the same. The differences between the leakage detection protection circuit shown in FIG. 8 and that shown in FIG. 2 are as follows:

The anode of controlled silicon rectifier V4 in the leakage detection protection circuit shown in FIG. 8 is connected, through tripping coil SOL and the parallel-connected instantaneous power supply connection switch KR-4 & power supply switch KR-2 linked with the reset button RESET, to the power live wire passing through induction coil L1 and self-excitation coil L2. The cathode of controlled silicon rectifier V4 is connected to the neutral wire at power input end passing through induction coil L1 and self-excitation coil L2.

Power input pin 6 of control chip IC1 in the leakage detection protection circuit shown in FIG. 8 is connected, through resistor R1, commutation diode V1, tripping coil SOL and the parallel-connected instantaneous power supply connection switch KR-4 & power supply switch KR-2 linked with the reset button RESET, to the power live wire passing through induction coil L1 and self-excitation coil L2. Working ground input pin 4 of control chip IC1 is connected to the neutral wire at power input end passing through induction coil L1 and self-excitation coil L2.

When the reset button RESET is in a tripped state, power supply switch KR-2 is closed, instantaneous power supply connection switch KR-4 is open, and power supply switch KR-2 supplies power to control chip IC1, controlled silicon rectifier V4 and tripping coil SOL. When the reset button RESET is pressed down, power supply switch KR-2 is open, instantaneous power supply connection switch KR-4 is closed, and instantaneous power supply connection switch KR-4 supplies power to control chip IC1, controlled silicon rectifier V4 and tripping coil SOL. After reset button RESET resets, instantaneous power supply connection switch KR-4 turns from closed state to open state, power supply switch KR-2 turns from an open state to a closed state, and power supply switch KR-2 supplies power to control chip IC1, controlled silicon rectifier V4, tripping coil SOL.

FIG. 9 is a circuit diagram of Embodiment 9 of this leakage detection protection circuit. The operation principle of the leakage detection protection circuit shown in FIG. 9 is identical to that of the leakage detection protection circuit shown in FIG. 7, and the circuits are generally the same. The differences between the leakage detection protection circuit shown in FIG. 9 and that shown in FIG. 7 are as follows:

In the leakage detection protection circuit shown in FIG. 9, a timer chip IC2 is added. The signal output end of this timer chip IC2 is connected to the control pole of controlled silicon rectifier V4. The timer output signal triggers controlled silicon rectifier V4 to break over in order to detect whether the life of the leakage detection protection circuit is terminated.

The advantages of this leakage detection protection circuit include: a more optimal and concise circuit, energy savings, and achievement of optimized functions and material savings by making use of the existing switch. During the resetting of the reset button, firstly the test button acts to carry out leakage testing of this circuit. Only if the circuit still has leakage protection function can reset button then be reset. With testing performed before resetting, the working sequence is more reasonable and safe.

Although the foregoing invention has been described in detail by way of illustration and example for purposes of clarity of understanding, it will be readily apparent to those of ordinary skill in the art in light of the description herein that certain changes and modifications may be made thereto without departing from the spirit or scope of the appended claims. It is also to be understood that the terminology used herein is for the purpose of describing particular aspects only, and is not intended to be limiting, since the scope of the present invention will be limited only by the appended claims.

In the preceding specification, various preferred embodiments have been described with reference to the accompanying drawings. It will, however, be evident that various other modifications and changes may be made thereto, and additional embodiments may be implemented, without departing from the broader scope of the claims that follow. The specification and drawings are accordingly to be regarded in an illustrative rather than restrictive sense.

I claim:

1. A leakage detection protection circuit comprising:
   a power input end comprising:
      a live wire with an input end and an output end; and
      a neutral wire with an input end and an output end;
   a power output end comprising:
      a live wire; and
      a neutral wire;
   a pair of coils having a first side and a second side, the pair of coils comprising
   an induction coil configured to detect a leakage current and a self-excitation coil configured to detect a low resistance fault;
   a control chip;
   a controlled silicon rectifier comprising:
      a cathode;
      an anode; and
      a control pole;
   a commutation diode;
   a resistor;
   a current limiting resistor;
   a filter capacitor;
   a reset button;
   a test button;
   a first test switch comprising:
      a first end; and
      a second end;
   a second test switch comprising:
      a first end; and
      a second end;
   a tripping coil with a built-in iron core; and
   a pair of main circuit switches linked with the reset button;
   wherein:
      the test button is linked with the reset button,
      the first test switch is linked with the test button,
      the second test switch is linked with the reset button,
      the live wire and the neutral wire of the power input end both pass through the pair of coils so that the input end of the live wire and the input end of the neutral wire of the power input end are on the first side of the pair of coils and the output end of the live wire and the output end of the neutral wire of the power input end are on the second side of the pair of coils,
      the first end of the first test switch is electrically connected through the current limiting resistor to the input end of the neutral wire of the power input end,
      the second end of the first test switch is electrically connected to the first end of the second test switch,
      the second end of the second test switch is electrically connected to the output end of the live wire of the power input end,
      the leakage detection protection circuit is configured so that when the reset button is in a tripped state, the first test switch is in an open state and the second test switch is in a closed state,
      the leakage detection protection circuit is configured so that when the reset button is pressed down, the first test switch changes from the open state to a closed state, the second test switch remains in the closed state, and the input end of the neutral wire of the power input end is electrically connected to the output end of the live wire of the power input end to enable generation of an analog leakage current, and
      the leakage detection protection circuit is configured so that when the reset button is in a reset state, the first test switch and the second test switch are both open.

2. The leakage detection protection circuit of claim 1 wherein:
   the leakage detection protection circuit further comprises an instantaneous power supply connection switch linked with the reset button and a power supply switch linked with the reset button,
   the leakage detection protection circuit is configured so that when the reset button is pressed down, the power supply switch is open and the instantaneous power supply connection switch closes to enable electrical connection to the control chip, the controlled silicon rectifier and the tripping coil,
   the leakage detection protection circuit is configured so that after the reset button resets, the instantaneous power supply connection switch is open and the power supply switch is closed to enable electrical connection to the control chip, the controlled silicon rectifier, and the tripping coil, and
   the leakage detection protection circuit is configured so that when the reset button is in the tripped state, the instantaneous power supply connection switch and the power supply switch are both open, and the control chip, the controlled silicon rectifier, and the tripping coil are electrically disconnected from the power input end.

3. The leakage detection protection circuit of claim 2 wherein:
   the leakage detection protection circuit further comprises a false-wiring warning circuit comprising a false-wiring lamp, a false-wiring resistor, and a false-wiring switch linked with the reset button,
   the false-wiring warning switch, the false-wiring warning lamp, and the false-wiring resistor are electrically connected in series,
   the false-wiring warning circuit further comprises a first end electrically connected to the live wire of the power output end, and a second end electrically connected to the neutral wire of the power output end, the leakage detection protection circuit is configured so that when the reset button is in the tripped state, the false-wiring switch is in a closed state, and the leakage detection protection circuit is configured so that when the reset button resets, the false-wiring switch is in an open state.

4. The leakage detection protection circuit of claim 3 wherein:

the instantaneous power supply connection switch and the power supply switch are electrically connected in parallel, the anode of the controlled silicon rectifier is electrically connected, through the tripping coil, to the input end of the live wire of the power input end, the cathode of the controlled silicon rectifier is electrically connected, through either the instantaneous power supply connection switch or the power supply switch, to the input end of the neutral wire of the power input end, the control chip further comprises a power input pin electrically connected through the resistor, the commutation diode, and the tripping coil, to the input end of the live wire of the power input end, and the control chip further comprises a ground input pin electrically connected, through either the instantaneous power supply connection switch or the power supply switch, to the input end of the neutral wire of the power input end.

5. The leakage detection protection circuit of claim 3 wherein:

the anode of the controlled silicon rectifier is electrically connected, through the tripping coil and either the instantaneous power supply connection switch or the power supply switch, to the output end of the live wire of the power input end, the cathode of the controlled silicon rectifier is electrically connected to the output end of the neutral wire of the power input end, the control chip further comprises a power input pin electrically connected through the resistor, the commutation diode, the tripping coil, and either the instantaneous power supply connection switch or the power supply switch, to the output end of the live wire of the power input end, and the control chip further comprises a ground input pin electrically connected to the output end of the neutral wire of the power input end.

6. The leakage detection protection circuit of claim 3 wherein:

the anode of the controlled silicon rectifier is electrically connected, through the tripping coil and either the instantaneous power supply connection switch or the power supply switch, to the input end of the live wire of the power input end, the cathode of the controlled silicon rectifier is electrically connected to the input end of the neutral wire of the power input end, the control chip further comprises a power input pin electrically connected through the resistor, the commutation diode, the tripping coil, and either the instantaneous power supply connection switch or the power supply switch, to the input end of the live wire of the power input end, and the control chip further comprises a ground input pin electrically connected to the input end of the neutral wire of the power input end.

7. The leakage detection protection circuit of claim 3 wherein:

the anode of the controlled silicon rectifier is electrically connected through the tripping coil to the input end of the live wire of the power input end, the cathode of the controlled silicon rectifier is electrically connected to the input end of the neutral wire of the power input end, the control chip further comprises a power input pin electrically connected through the resistor, the commutation diode, the tripping coil, either the instantaneous power supply connection switch or the power supply switch, and the tripping coil, to the input end of the live wire of the power input end, and the control chip further comprises a ground input pin electrically connected to the input end of the neutral wire of the power input end.

8. The leakage detection protection circuit of claim 1 wherein:

the leakage detection protection circuit further comprises an instantaneous power supply connection switch linked with the reset button and a power supply switch linked with the reset button, the leakage detection protection circuit is configured so that when the reset button is pressed down, the power supply switch is open and the instantaneous power supply connection switch closes to supply power to the control chip, the controlled silicon rectifier and the tripping coil, the leakage detection protection circuit is configured so that when the reset button resets, the instantaneous power supply connection switch is open and the power supply switch is closed to enable supply power to the control chip, the controlled silicon rectifier, and the tripping coil, and the leakage detection protection circuit is configured so that when the reset button is in the tripped state, the instantaneous power supply connection switch is open and the power supply switch is closed to prevent supply power to the control chip, the controlled silicon rectifier, and the tripping coil.

9. The leakage detection protection circuit of claim 8 wherein:

the leakage detection protection circuit further comprises a false-wiring warning circuit comprising a false-wiring lamp, a false-wiring resistor, and a false-wiring switch linked with the reset button, the false-wiring warning switch, the false-wiring warning lamp, and the false-wiring resistor are connected in series, the false-wiring warning circuit further comprises a first end electrically connected to the live wire of the power output end, and a second end electrically connected to the neutral wire of the power output end, the leakage detection protection circuit is configured so that when the reset button is in the tripped state, the false-wiring switch is in a closed state, and the leakage detection protection circuit is configured so that when the reset button resets, the false-wiring switch is in an open state.

10. The leakage detection protection circuit of claim 9 wherein:

the instantaneous power supply connection switch and the power supply switch are electrically connected in parallel, the anode of the controlled silicon rectifier is electrically connected, through the tripping coil, to the input end of the live wire of the power input end, the cathode of the controlled silicon rectifier is electrically connected, through either the instantaneous power supply connection switch or the power supply switch, to the input end of the neutral wire of the power input end, the control chip further comprises a power input pin electrically connected through the resistor, the commutation diode, and the tripping coil, to the input end of the live wire of the power input end, and the control chip further comprises a ground input pin electrically connected, through either the instantaneous power supply connection switch or the power supply switch, to the input end of the neutral wire of the power input end.

11. The leakage detection protection circuit of claim 9 wherein:

the anode of the controlled silicon rectifier is electrically connected, through the tripping coil and either the instantaneous power supply connection switch or the power supply switch, to the output end of the live wire of the power input end, the cathode of the controlled silicon rectifier is electrically connected to the output end of the neutral wire of the power input end, the control chip further comprises a power input pin electrically connected through the resistor, the commutation diode, the tripping coil, and either the instantaneous power supply connection switch or the power supply switch, to the output end of the live wire of the power input end, and the control chip further comprises a ground input pin electrically connected to the output end of the neutral wire of the power input end.

12. The leakage detection protection circuit of claim 9 wherein:

the anode of the controlled silicon rectifier is electrically connected, through the tripping coil and either the instantaneous power supply connection switch or the power supply switch, to the input end of the live wire of the power input end, the cathode of the controlled silicon rectifier is electrically connected to the input end of the neutral wire of the power input end, the control chip further comprises a power input pin electrically connected through the resistor, the commutation diode, the tripping coil, and either the instantaneous power supply connection switch or the power supply switch, to the input end of the live wire of the power input end, and the control chip further comprises a ground input pin electrically connected to the input end of the neutral wire of the power input end.

13. The leakage detection protection circuit of claim 9 wherein:

the anode of the controlled silicon rectifier is electrically connected through the tripping coil to the input end of the live wire of the power input end, the cathode of the controlled silicon rectifier is electrically connected to the input end of the neutral wire of the power input end, the control chip further comprises a power input pin electrically connected through the resistor, the commutation diode, the tripping coil, either the instantaneous power supply connection switch or the power supply switch, and the tripping coil, to the input end of the live wire of the power input end, and the control chip further comprises a ground input pin electrically connected to the input end of the neutral wire of the power input end.

14. A leakage detection protection circuit comprising:
a power input end comprising:
   a live wire with a first end and a second end; and
   a neutral wire with a first end and a second end;
a power output end comprising:
   a live wire; and
   a neutral wire;
a pair of coils having a first side and a second side, the pair of coils comprising an induction coil configured to detect a leakage current and a self-excitation coil configured to detect a low resistance fault;
a control chip
a controlled silicon rectifier comprising:
   a cathode;
   an anode; and
   a control pole;
a commutation diode;
a resistor;
a current limiting resistor;
a filter capacitor;
a reset button;
a test button;
a first test switch comprising:
   a first end; and
   a second end;
a second test switch comprising:
   a first end; and
   a second end;
a tripping coil with a built-in iron core; and
a pair of main circuit switches linked with the reset button;
wherein:
the test button is linked with the reset button,
the first test switch is linked with the test button,
the second test switch is linked with the reset button,
the live wire and the neutral wire of the power input end both pass through the pair of coils so that the first end of the live wire and the first end of the neutral wire of the power input end are on the first side of the pair of coils and second end of the live wire and the second end of the neutral wire of the power input end are on the second side of the pair of coils,
the first end of the first test switch is electrically connected through the current limiting resistor to the first end of the neutral wire of the power input end,
the second end of the first test switch is electrically connected to the first end of the second test switch,
the second end of the second test switch is electrically connected to the second end of the neutral wire of the power input end,
the leakage detection protection circuit is configured so that when the reset button is in a tripped state, the first test switch is in an open state and the second test switch is in a closed state,
the leakage detection protection circuit is configured so that when the reset button is pressed down, the first test switch changes from the open state to a closed state, the second test switch remains in the closed state, and the first end of the neutral wire of the power input end is connected to the second end of the neutral wire of the power input end to enable detection of a low resistance fault, and
the leakage detection protection circuit is configured so that when the reset button is in a reset state, the first test switch and the second test switch are both open.

15. The leakage detection protection circuit of claim 14 wherein:
the leakage detection protection circuit further comprises an instantaneous power supply connection switch linked with the reset button and a power supply switch linked with the reset button,
the leakage detection protection circuit is configured so that when the reset button is pressed down, the power supply switch is open and the instantaneous power supply connection switch closes to enable electrical connection to the control chip, the controlled silicon rectifier and the tripping coil,
the leakage detection protection circuit is configured so that after the reset button resets, the instantaneous power supply connection switch is open and the power supply switch is closed to enable electrical connection to the control chip, the controlled silicon rectifier, and the tripping coil, and
the leakage detection protection circuit is configured so that when the reset button is in the tripped state, the instantaneous power supply connection switch and the power supply switch are both open, and the control chip, the controlled silicon rectifier, and the tripping coil are electrically disconnected from the power input end.

16. The leakage detection protection circuit of claim 15 wherein:
the leakage detection protection circuit further comprises a false-wiring warning circuit comprising a false-wiring lamp, a false-wiring resistor, and a false-wiring switch linked with the reset button,
the false-wiring warning switch, the false-wiring warning lamp, and the false-wiring resistor are connected in series,
the false-wiring warning circuit further comprises a first end electrically connected to the live wire of the power output end, and a second end electrically connected to the neutral wire of the power output end,
the leakage detection protection circuit is configured so that when the reset button is in the tripped state, the false-wiring switch is in a closed state, and
the leakage detection protection circuit is configured so that when the reset button resets, the false-wiring switch is in an open state.

17. The leakage detection protection circuit of claim 16 wherein:
the instantaneous power supply connection switch and the power supply switch are electrically connected in parallel,
the anode of the controlled silicon rectifier is electrically connected, through the tripping coil, to the input end of the live wire of the power input end,
the cathode of the controlled silicon rectifier is electrically connected, through either the instantaneous power supply connection switch or the power supply switch, to the input end of the neutral wire of the power input end,
the control chip further comprises a power input pin electrically connected through the resistor, the commutation diode, and the tripping coil, to the input end of the live wire of the power input end, and
the control chip further comprises a ground input pin electrically connected, through either the instantaneous power supply connection switch or the power supply switch, to the input end of the neutral wire of the power input end.

18. The leakage detection protection circuit of claim 16 wherein:

the anode of the controlled silicon rectifier is electrically connected, through the tripping coil and either the instantaneous power supply connection switch or the power supply switch, to the output end of the live wire of the power input end,
the cathode of the controlled silicon rectifier is electrically connected to the output end of the neutral wire of the power input end,
the control chip further comprises a power input pin electrically connected through the resistor, the commutation diode, the tripping coil, and either the instantaneous power supply connection switch or the power supply switch, to the output end of the live wire of the power input end, and
the control chip further comprises a ground input pin electrically connected to the output end of the neutral wire of the power input end.

19. The leakage detection protection circuit of claim 16 wherein:
the anode of the controlled silicon rectifier is electrically connected, through the tripping coil and either the instantaneous power supply connection switch or the power supply switch, to the input end of the live wire of the power input end,
the cathode of the controlled silicon rectifier is electrically connected to the input end of the neutral wire of the power input end,
the control chip further comprises a power input pin electrically connected through the resistor, the commutation diode, the tripping coil, and either the instantaneous power supply connection switch or the power supply switch, to the input end of the live wire of the power input end, and
the control chip further comprises a ground input pin electrically connected to the input end of the neutral wire of the power input end.

20. The leakage detection protection circuit of claim 16 wherein:
the anode of the controlled silicon rectifier is electrically connected through the tripping coil to the input end of the live wire of the power input end,
the cathode of the controlled silicon rectifier is electrically connected to the input end of the neutral wire of the power input end,
the control chip further comprises a power input pin electrically connected through the resistor, the commutation diode, the tripping coil, either the instantaneous power supply connection switch or the power supply switch, and the tripping coil, to the input end of the live wire of the power input end, and
the control chip further comprises a ground input pin electrically connected to the input end of the neutral wire of the power input end.

21. The leakage detection protection circuit of claim 14 wherein:
the leakage detection protection circuit further comprises an instantaneous power supply connection switch linked with the reset button and a power supply switch linked with the reset button,
the leakage detection protection circuit is configured so that when the reset button is pressed down, the power supply switch is open and the instantaneous power supply connection switch closes to supply power to the control chip, the controlled silicon rectifier and the tripping coil,
the leakage detection protection circuit is configured so that when the reset button resets, the instantaneous power supply connection switch is open and the power supply switch is closed to enable supply power to the control chip, the controlled silicon rectifier, and the tripping coil, and the leakage detection protection circuit is configured so that when the reset button is in the tripped state, the instantaneous power supply connection switch is open and the power supply switch is closed to prevent supply power to the control chip, the controlled silicon rectifier, and the tripping coil.

22. The leakage detection protection circuit of claim 21 wherein:

the leakage detection protection circuit further comprises a false-wiring warning circuit comprising a false-wiring lamp, a false-wiring resistor, and a false-wiring switch linked with the reset button, the false-wiring warning switch, the false-wiring warning lamp, and the false-wiring resistor are electrically connected in series, the false-wiring warning circuit further comprises a first end electrically connected to the live wire of the power output end, and a second end electrically connected to the neutral wire of the power output end, the leakage detection protection circuit is configured so that when the reset button is in the tripped state, the false-wiring switch is in a closed state, and the leakage detection protection circuit is configured so that when the reset button resets, the false-wiring switch is in an open state.

23. The leakage detection protection circuit of claim 22 wherein:

the instantaneous power supply connection switch and the power supply switch are electrically connected in parallel, the anode of the controlled silicon rectifier is electrically connected, through the tripping coil, to the input end of the live wire of the power input end, the cathode of the controlled silicon rectifier is electrically connected, through either the instantaneous power supply connection switch or the power supply switch, to the input end of the neutral wire of the power input end, the control chip further comprises a power input electrically connected through the resistor, the commutation diode, and the tripping coil, to the input end of the live wire of the power input end, and the control chip further comprises a ground input pin electrically connected, through either the instantaneous power supply connection switch or the power supply switch, to the input end of the neutral wire of the power input end.

24. The leakage detection protection circuit of claim 22 wherein:

the anode of the controlled silicon rectifier is electrically connected, through the tripping coil and either the instantaneous power supply connection switch or the power supply switch, to the output end of the live wire of the power input end, the cathode of the controlled silicon rectifier is electrically connected to the output end of the neutral wire of the power input end, the control chip further comprises a power input pin electrically connected through the resistor, the commutation diode, the tripping coil, and either the instantaneous power supply connection switch or the power supply switch, to the output end of the live wire of the power input end, and the control chip further comprises a ground input pin electrically connected to the output end of the neutral wire of the power input end.

25. The leakage detection protection circuit of claim 22 wherein:

the anode of the controlled silicon rectifier is electrically connected, through the tripping coil and either the instantaneous power supply connection switch or the power supply switch, to the input end of the live wire of the power input end, the cathode of the controlled silicon rectifier is electrically connected to the input end of the neutral wire of the power input end, the control chip further comprises a power input pin electrically connected through the resistor, the commutation diode, the tripping coil, and either the instantaneous power supply connection switch or the power supply switch, to the input end of the live wire of the power input end, and the control chip further comprises a ground input pin electrically connected to the input end of the neutral wire of the power input end.

26. The leakage detection protection circuit of claim 22 wherein:

the anode of the controlled silicon rectifier is electrically connected through the tripping coil to the input end of the live wire of the power input end, the cathode of the controlled silicon rectifier is electrically connected to the input end of the neutral wire of the power input end, the control chip further comprises a power input pin electrically connected through the resistor, the commutation diode, the tripping coil, either the instantaneous power supply connection switch or the power supply switch, and the tripping coil, to the input end of the live wire of the power input end, and the control chip further comprises a ground input pin electrically connected to the input end of the neutral wire of the power input end.

* * * * *